United States Patent
Wu et al.

(10) Patent No.: US 11,038,153 B2
(45) Date of Patent: Jun. 15, 2021

(54) METHODS FOR HMDSO THERMAL STABILITY

(71) Applicant: Applied Materials, Inc., Santa Clara, CA (US)

(72) Inventors: Wen-Hao Wu, San Jose, CA (US); Jrjyan Jerry Chen, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/248,526

(22) Filed: Jan. 15, 2019

(65) Prior Publication Data
US 2020/0227689 A1    Jul. 16, 2020

(51) Int. Cl.
*H01L 51/56* (2006.01)
*H01L 51/00* (2006.01)
*H01L 51/52* (2006.01)

(52) U.S. Cl.
CPC .......... *H01L 51/56* (2013.01); *H01L 51/0094* (2013.01); *H01L 51/5256* (2013.01); *H01L 2251/558* (2013.01)

(58) Field of Classification Search
CPC . H01L 41/5256; H01L 41/5253; H01L 41/56; H01L 41/094; H01L 41/448; H01L 21/02211; H01L 21/02216; H01L 21/02274; H01L 51/56; H01L 51/0094; H01L 51/5256; H01L 51/558; H01L 51/5253; C08L 83/00; C08L 83/06; C23C 16/401; C23C 16/505

See application file for complete search history.

(56) References Cited

U.S. PATENT DOCUMENTS

| | | | | |
|---|---|---|---|---|
| 5,521,126 | A * | 5/1996 | Okamura | H01L 21/02216 438/789 |
| 6,200,893 | B1 * | 3/2001 | Sneh | H01L 21/31604 438/685 |
| 6,926,572 | B2 | 8/2005 | Park et al. | |
| 7,129,580 | B1 * | 10/2006 | Londergan | H01L 21/28562 257/751 |
| 8,772,066 | B2 | 7/2014 | Chen et al. | |
| 9,331,311 | B2 | 5/2016 | Chen | |
| 9,397,318 | B2 | 7/2016 | Chen et al. | |

(Continued)

OTHER PUBLICATIONS

International Search Report and Written Opinion for International Application No. PCT/US2019/054124 dated Jan. 29, 2020.

*Primary Examiner* — Caridad Everhart
(74) *Attorney, Agent, or Firm* — Patterson + Sheridan LLP (57) ABSTRACT

Embodiments of the present disclosure generally relate to methods for forming an organic light emitting diode (OLED) device. Forming the OLED device comprises depositing a first barrier layer on a substrate having an OLED structure disposed thereon. A first sublayer of a buffer layer is then deposited on the first barrier layer. The first sublayer of the buffer layer is cured with a mixed gas plasma. Curing the first sublayer comprises generating water from the mixed gas plasma in a process chamber in which the curing occurs. The deposition of the first sublayer and the curing of the first sublayer is repeated one or more times to form a completed buffer layer. A second barrier layer is then deposited on the completed buffer layer.

20 Claims, 6 Drawing Sheets

(56) References Cited

U.S. PATENT DOCUMENTS

| | | | |
|---|---|---|---|
| 9,431,631 B2 | 8/2016 | Chen et al. | |
| 9,530,990 B2 | 12/2016 | Chen et al. | |
| 9,828,673 B2 * | 11/2017 | Niu | C23C 16/45536 |
| 9,988,705 B2 * | 6/2018 | Ockenfuss | H01J 37/34 |
| 10,181,581 B2 | 1/2019 | Chen | |
| 2001/0002280 A1 * | 5/2001 | Sneh | C23C 16/45536 |
| | | | 427/255.28 |
| 2001/0024387 A1 * | 9/2001 | Raaijmakers | H01L 21/02189 |
| | | | 365/200 |
| 2005/0233598 A1 * | 10/2005 | Jung | H01L 21/3142 |
| | | | 438/785 |
| 2005/0260347 A1 * | 11/2005 | Narwankar | H01L 21/0214 |
| | | | 427/248.1 |
| 2005/0287688 A1 | 12/2005 | Won et al. | |
| 2007/0237697 A1 * | 10/2007 | Clark | C23C 16/45525 |
| | | | 423/263 |
| 2008/0164476 A1 * | 7/2008 | Park | C30B 25/02 |
| | | | 257/66 |
| 2010/0093184 A1 * | 4/2010 | Wu | C23C 16/45536 |
| | | | 438/765 |
| 2012/0228668 A1 | 9/2012 | Thoumazet et al. | |
| 2013/0337657 A1 * | 12/2013 | Savas | H01J 37/32036 |
| | | | 438/778 |
| 2014/0024180 A1 | 1/2014 | Choi et al. | |
| 2014/0256070 A1 | 9/2014 | Chen et al. | |
| 2014/0291658 A1 * | 10/2014 | Muller | H01L 33/44 |
| | | | 257/40 |
| 2016/0083842 A1 * | 3/2016 | Niu | C23C 16/45536 |
| | | | 427/576 |
| 2016/0362784 A1 * | 12/2016 | Isobe | H01L 21/02271 |

* cited by examiner

FIG. 3H ial structure is the formation of non-emissive dark spots due to moisture or oxygen ingress. For this reason, OLED structures are typically encapsulated by an organic layer sandwiched between inorganic layers. The organic layer is utilized to fill any voids or defects in the first inorganic layer such that the second inorganic layer has a substantially uniform surface or deposition.

METHODS FOR HMDSO THERMAL STABILITY

BACKGROUND

Field

Embodiments of the present disclosure generally relate to methods for forming an organic light emitting diode (OLED) device, more particularly, to methods for encapsulating an OLED structure.

Description of the Related Art

An OLED is used in the manufacture of television screens, computer monitors, mobile phones, other hand-held devices, etc. for displaying information. OLED displays have gained significant interest recently in display applications due to their faster response time, larger viewing angles, higher contrast, lighter weight, low power and amenability to flexible substrates such as compared to liquid crystal displays (LCD).

OLED structures may have a limited lifetime, characterized by a decrease in electroluminescence efficiency and an increase in drive voltage. A main reason for the degradation of OLED structures is the formation of non-emissive dark spots due to moisture or oxygen ingress. For this reason, OLED structures are typically encapsulated by an organic layer sandwiched between inorganic layers. The organic layer is utilized to fill any voids or defects in the first inorganic layer such that the second inorganic layer has a substantially uniform surface or deposition.

Therefore, an improved method and apparatus for encapsulating an OLED structure is needed.

SUMMARY

Embodiments of the present disclosure generally relate to methods for forming an OLED device. Forming the OLED device comprises depositing a first barrier layer on a substrate having an OLED structure disposed thereon. A first sublayer of a buffer layer is then deposited on the first barrier layer. The first sublayer of the buffer layer is cured with a mixed gas plasma. Curing the first sublayer comprises generating water from the mixed gas plasma in a process chamber in which the curing occurs. The deposition of the first sublayer and the curing of the first sublayer is repeated one or more times to form a completed buffer layer. A second barrier layer is then deposited on the completed buffer layer.

In one embodiment, a method for forming an OLED device comprises depositing a first barrier layer on a region of a substrate having an OLED structure disposed thereon, depositing a first sublayer of a buffer layer on the first barrier layer and curing the first sublayer with a mixed gas plasma. Curing the first sublayer comprises generating water from the mixed gas plasma in a chamber in which the curing occurs. The method further comprises repeating the deposition of the first sublayer and the curing of the first sublayer one or more times to form a completed buffer layer, and depositing a second barrier layer on the completed buffer layer.

In another embodiment, a method for forming an OLED device in a vacuum environment of a single process chamber comprises depositing a first barrier layer on a region of a substrate having an OLED structure disposed thereon and depositing a first sublayer of a buffer layer on the first barrier layer. The first sublayer has a thickness between about 0.05-0.2 µm. The method further comprises curing the first sublayer with a mixed gas plasma. Curing the first sublayer comprises generating water from the mixed gas plasma in the single process chamber in which the curing occurs. The method further comprises repeating the deposition of the first sublayer and the curing of the first sublayer one or more times to form a completed buffer layer. The completed buffer layer has a thickness between about 0.5-1.5 µm. The method further comprises depositing a second barrier layer on the completed buffer layer.

In yet another embodiment, a method for forming an OLED device in a vacuum environment of a single process chamber comprises forming a contact layer over a substrate, forming an OLED structure over the contact layer, depositing a first barrier layer over the OLED structure, depositing a first sublayer of a buffer layer on the first barrier layer and curing the first sublayer with a mixed gas plasma. Curing the first sublayer comprises generating water from the mixed gas plasma in the single process chamber in which the curing occurs. The method further comprises repeating the deposition of the first sublayer and the curing of the first sublayer one or more times to form a completed buffer layer, and depositing a second barrier layer on the completed buffer layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods for forming an OLED device. Forming the OLED device comprises depositing a first barrier layer on a substrate having an OLED structure disposed thereon. A first sublayer of a buffer layer is then deposited on the first barrier layer. The first sublayer of the buffer layer is cured with a mixed gas plasma. Curing the first sublayer comprises generating water from the mixed gas plasma in a process chamber in which the curing occurs. The deposition of the first sublayer and the curing of the first sublayer is repeated one or more times to form a completed buffer layer. A second barrier layer is then deposited on the completed buffer layer.

Figure 1:
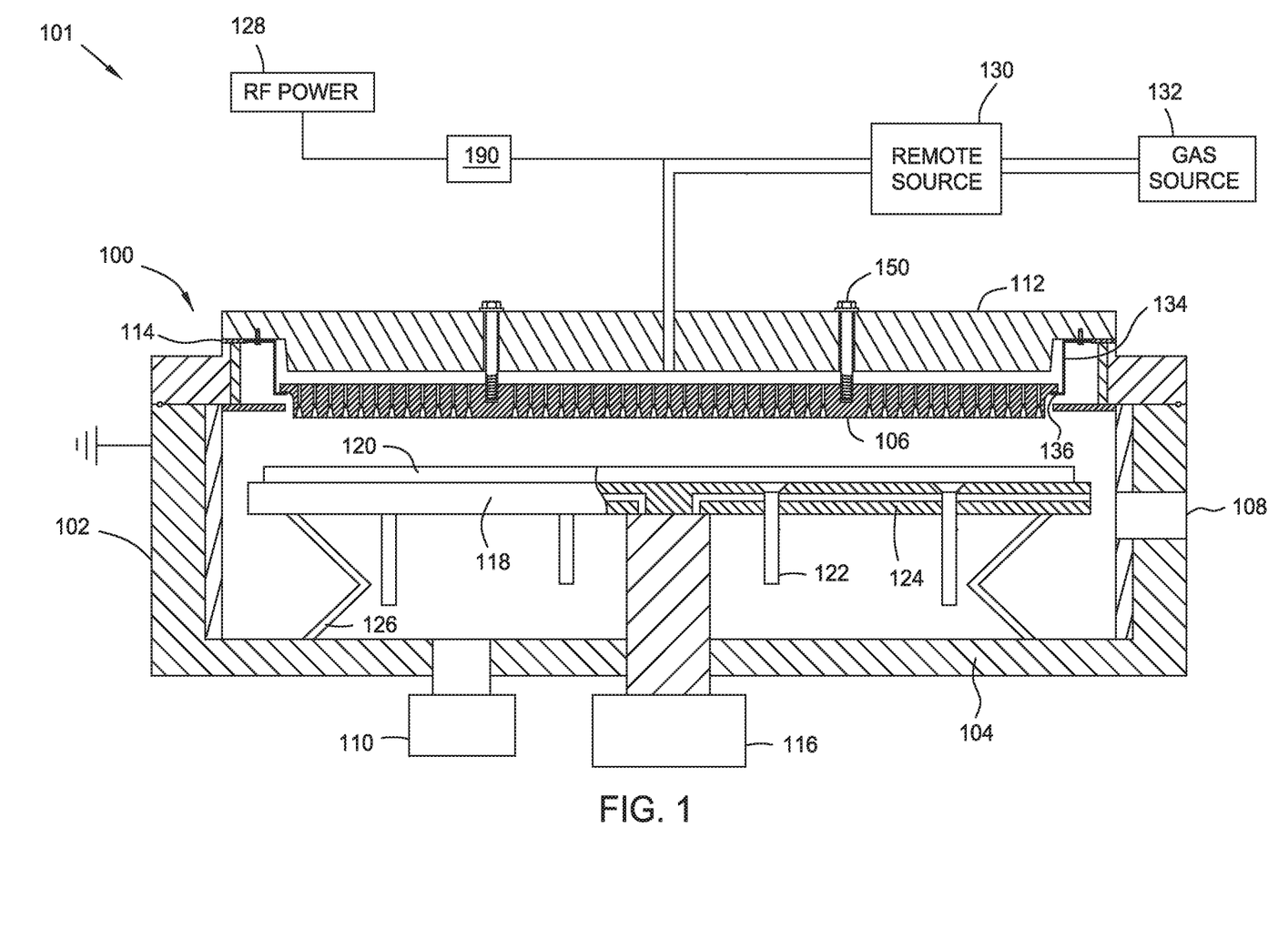
FIG. 1 is a schematic, cross-sectional view of a PECVD apparatus that may be used to perform the methods described herein, according to one embodiment.

FIG. 1 is a schematic, cross sectional view of a plasma enhanced chemical vapor deposition (PECVD) apparatus 101 that may be used to perform the operations described herein. The PECVD apparatus 101 includes a chamber 100 in which one or more films may be deposited onto a substrate 120. The chamber 100 generally includes walls 102, a bottom 104, and a showerhead 106, which collectively define a process volume. The process volume may be a vacuum environment. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move the substrate 120 to and from the substrate receiving surface. The substrate support 118 may also include heating and/or cooling elements 124 to maintain the substrate support 118 at a desired temperature. The substrate support 118 may also include RF return straps 126 to provide an RF return path at the periphery of the substrate support 118.

The showerhead 106 is coupled to a backing plate 112 by a fastening mechanism 150. The showerhead 106 may be coupled to the backing plate 112 by one or more fastening mechanisms 150 to help prevent sag and/or control the straightness/curvature of the showerhead 106.

A gas source 132 is coupled to the backing plate 112 to provide gas through gas passages in the showerhead 106 to a processing area between the showerhead 106 and the substrate 120. A vacuum pump 110 is coupled to the chamber 100 to maintain the process volume at a desired pressure. An RF source 128 is coupled through a match network 190 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100 to form the vacuum environment.

Figure 2:
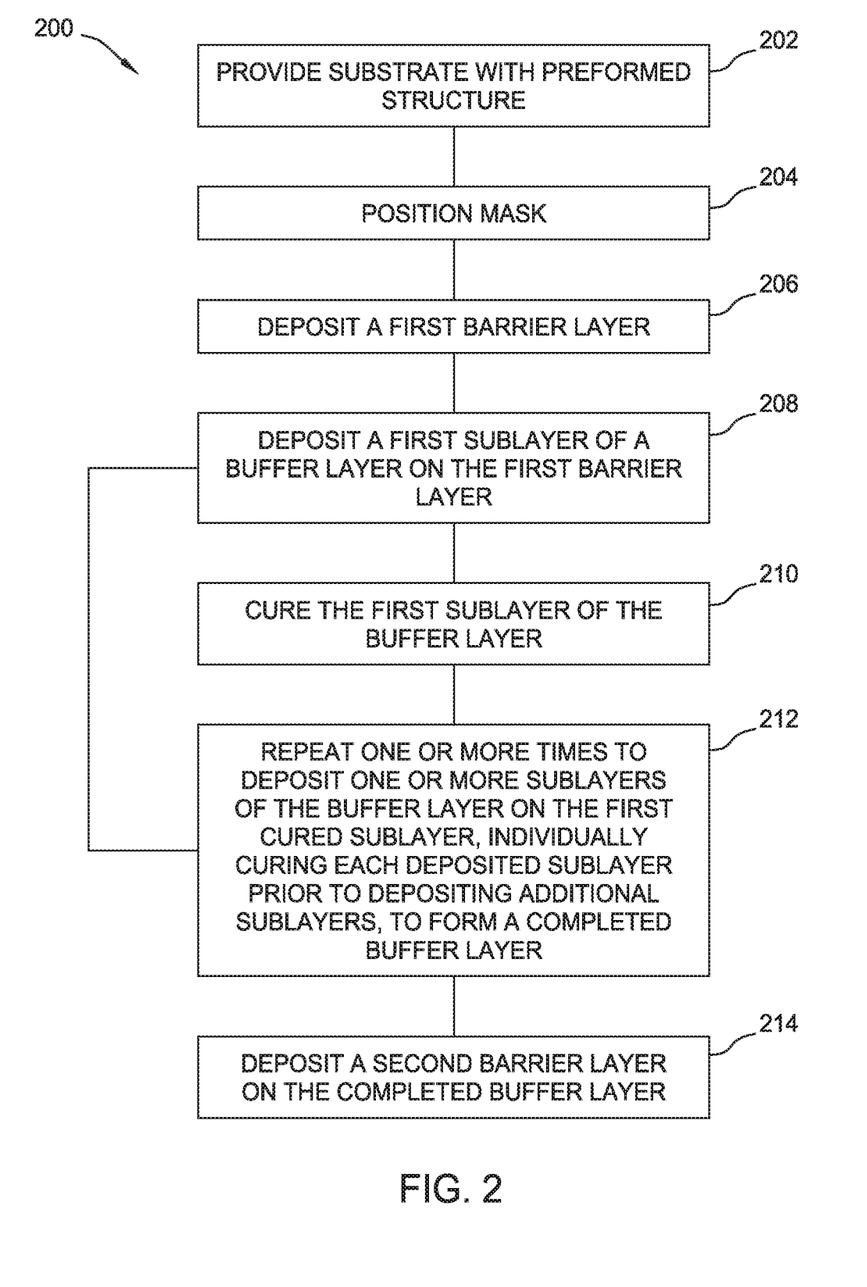
FIG. 2 is a flow diagram of a method for forming an OLED device, according to one embodiment.
Figure 3A:
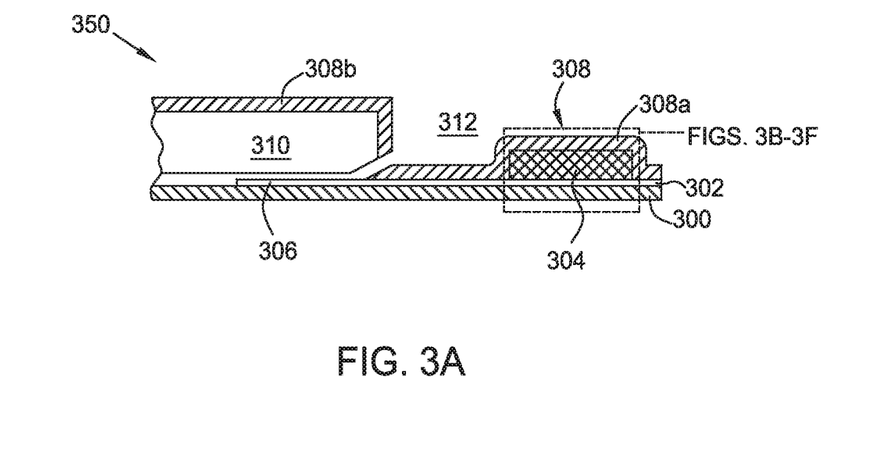
FIGS. 3A-3H illustrate schematic cross-sectional views of the OLED device during various stages of the method of FIG. 2, according to one embodiment.

FIG. 2 is a flow diagram of a method 200 for forming an OLED device, according to one embodiment. FIGS. 3A-3G illustrate schematic cross-sectional views of an OLED device 350 during different stages of the method 200 of FIG. 2. FIGS. 3B-3F illustrate a zoomed-in section of FIG. 3A. The method 200 may be utilized with the PECVD apparatus 101 of FIG. 1. The method 200 starts at operation 202 by providing a substrate 300 having a preformed OLED structure 304 disposed thereon. The substrate 300 may be the substrate 120 of FIG. 1. The substrate 300 may have a contact layer 302 disposed thereon, with the OLED structure 304 disposed on the contact layer 302, as shown in FIG. 3A.

At operation 204, a mask 310 is aligned over the substrate 300 such that the OLED structure 304 is exposed through an opening 312 unprotected by the mask 310, as shown in FIG. 3A. The mask 310 is positioned such that a portion 306 of the contact layer 302 adjacent the OLED structure 304 is covered by the mask 310 so that the any subsequently deposited material does not deposit on the portion 306. The portion 306 of the contact layer 302 is the electrical contact for the OLED device 350, thus no material should be deposited thereon. The mask 310 may be made from a metal material, such as INVAR®.

At operation 206, a first barrier layer 308 is deposited on the substrate 300, as shown in FIG. 3A. The first barrier layer 308 has a first portion 308a and a second portion 308b. The first portion 308a of the first barrier layer 308 is deposited through the opening 312 onto a region of the substrate 300 exposed by the mask 310, which includes the OLED structure 304 and a portion of the contact layer 302. The second portion 308b of the first barrier layer 308 is deposited on the mask 310 covering a second region of the substrate 300, which includes the portion 306 of the contact layer 302. The first barrier layer 308 is a dielectric layer, such as silicon nitride (SiN), silicon oxynitride (SiON), silicon dioxide ($SiO_2$), aluminum oxide ($Al_2O_3$), aluminum nitride (AlN), or other suitable dielectric layers. The first barrier layer 308 may be deposited by a suitable deposition technique, such as chemical vapor deposition (CVD), PECVD, physical vapor deposition (PVD), spin-coating, or other suitable technique.

Figure 3B:
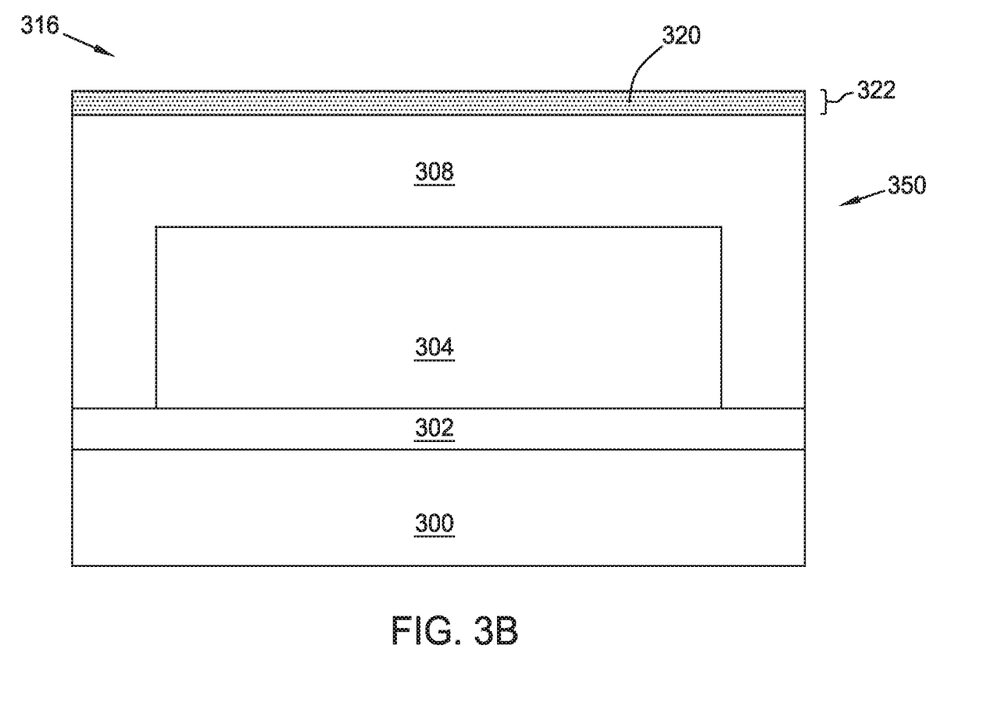

At operation 208, after the first barrier layer 308 is deposited on the substrate 300, a first sublayer 320 of a partial buffer layer 316 is deposited on the first barrier layer 308, as shown in FIG. 3B. The first sublayer 320 of the partial buffer layer 316 may have a thickness 322 of about 0.05-0.2 µm. The first sublayer 320 of the partial buffer layer 316 may be deposited on the substrate 300 through the opening 312 of the mask 310 on the region of the substrate 300 exposed by the mask 310, covering the first portion 308a of the first barrier layer 308. While not shown in the zoomed-in section illustrated in FIG. 3B, the first sublayer 320 of the partial buffer layer 316 is deposited over the second portion 308b of the first barrier layer 308.

The partial buffer layer 316 may be fluorinated plasma-polymerized hexamethyldisiloxane (pp-HMDSO:F) deposited in a PECVD chamber, such as the chamber 100 of FIG. 1. Deposition of the pp-HMDSO:F layer is achieved by flowing one or more fluorine-containing gases and HMDSO gas along with either $O_2$ or $N_2O$ gas. The fluorine-containing gas may be nitrogen fluoride ($NF_3$), silicon fluoride ($SiF_4$), fluorine gas ($F_2$), carbon tetrafluoride ($CE_4$), or any combination thereof. Fluorine doped plasma polymerized HMDSO layer has superior particle coverage performance and surface planarization effect. The resulting first sublayer 320 has a fluorine content of less than 10 atomic percent.

During the deposition of the pp-HMDSO:F, the ratio of the flow rates of the fluorine-containing gas and the HMDSO gas may be between about 0.25 and about 1.5. If there is too much fluorine, the carbon in the HMDSO may be taken out. In one embodiment, the PECVD of the pp-HMDSO:F is performed under the following conditions. The $SiF_4$ has a flow rate of 125 standard cubic centimeters per minute (sccm) and HMDSO has a flow rate of 300 sccm. In other words, the ratio of $SiF_4$ to HMDSO is between about 0.40 to about 0.45. The plasma is generated at 700 W and the chamber pressure is about 1800 mTorr. The pp-HMDSO:F is deposited at about 80 degrees Celsius and the distance between the substrate 300 and the showerhead 106 is between about 500-1200 mil.

A buffer layer 316 comprising pp-HMDSO:F may have characteristics including stress relief, particle conformality, and flexibility. These characteristics of the pp-HMDSO:F buffer layer 316 allow the buffer layer 316 comprising pp-HMDSO:F to decouple the defects in the first barrier layer 308, as well as to planarize surface irregularities to form a smooth surface. However, due to the formation process of the pp-HMDSO:F buffer layer, the pp-HMDSO:F buffer layer may be physically soft, which will impose an integration issue when stacked with barrier layers. When a barrier layer stacks on top of a soft pp-HMDSO:F buffer layer, a wrinkled surface is formed, and the soft pp-HMDSO:F layer loses its optical transmittance, rendering the device unsuitable as a top emission OLED device.

Figure 3C:
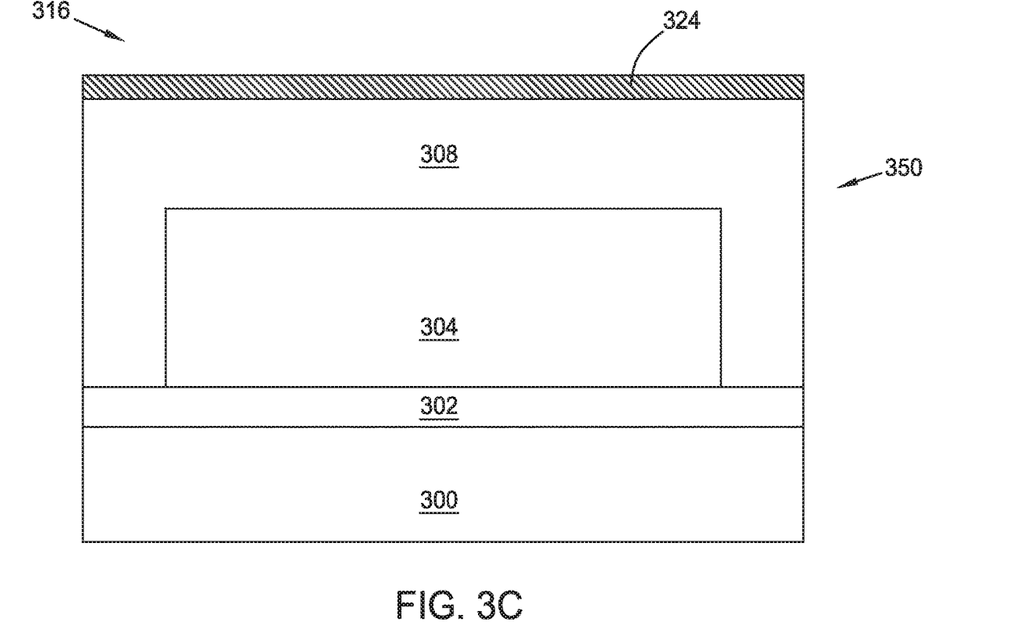

In order to harden the partial buffer layer 316 and prevent a wrinkled surface from forming, plasma curing of the partial buffer layer 316 is utilized. At operation 210, the first sublayer 320 of the partial buffer layer 316 is cured to form a first hardened sublayer 324 of the partial buffer layer 316, as shown in FIG. 3C.

The curing of the partial buffer layer 316 is performed in a vacuum environment. In one embodiment, the curing is performed in the same process chamber as the deposition of the first sublayer 320 of the buffer layer (i.e. an in-situ curing process). The curing is performed using a mixed gas plasma, or a plasma produced from a gaseous mixture, that is configured to generate water ($H_2O$) in the chamber in which the curing occurs. The mixed gas plasma is configured to generate water for condensation curing, which introduces moisture into the chamber. The mixed gas plasma may comprise two or more gases selected from the group of ammonia ($NH_3$), nitrous oxide ($N_2O$), hydrogen ($H_2$), and oxygen ($O_2$). For example, the mixed gas plasma may comprise $NH_3$ and $N_2O$, $H_2$ and $N_2O$, $H_2$ and $O_2$, or $NH_3$ and $O_2$. In one embodiment, the mixed gas plasma may further comprise fluorine, such as nitrogen fluoride ($NF_3$), silicon fluoride ($SiF_4$), fluorine gas ($F_2$), and/or carbon tetrafluoride ($CF_4$).

The ratio of the mixed gases in the mixed gas plasma depends on the spacing between the substrate 300 and a showerhead of the processing chamber, such as the showerhead 106 of FIG. 1. For example, if the spacing between the substrate 300 and the showerhead 106 is about 650 mil, a 1:1 ratio of $NH_3$ to $N_2O$ may be utilized for a curing duration of about 10-15 seconds. In another example, if the spacing between the substrate 300 and the showerhead 106 is about 1000 mil, a 3:1 ratio of $NH_3$ to $N_2O$ may be utilized for a curing duration of about 30 seconds. Thus, the curing duration depends on the ratio of the mixed gases in the mixed gas plasma and the spacing between the substrate 300 and the showerhead 106. As such, the curing duration may be increased to compensate for a higher ratio between the mixed gases of the mixed gas plasma and for a larger spacing between the substrate 300 and the showerhead 106. The first hardened sublayer 324 maintains its flexibility and optical transmittance as one or more sublayers layers of the buffer layer and barrier layers are subsequently deposited thereon.

Figure 3D:
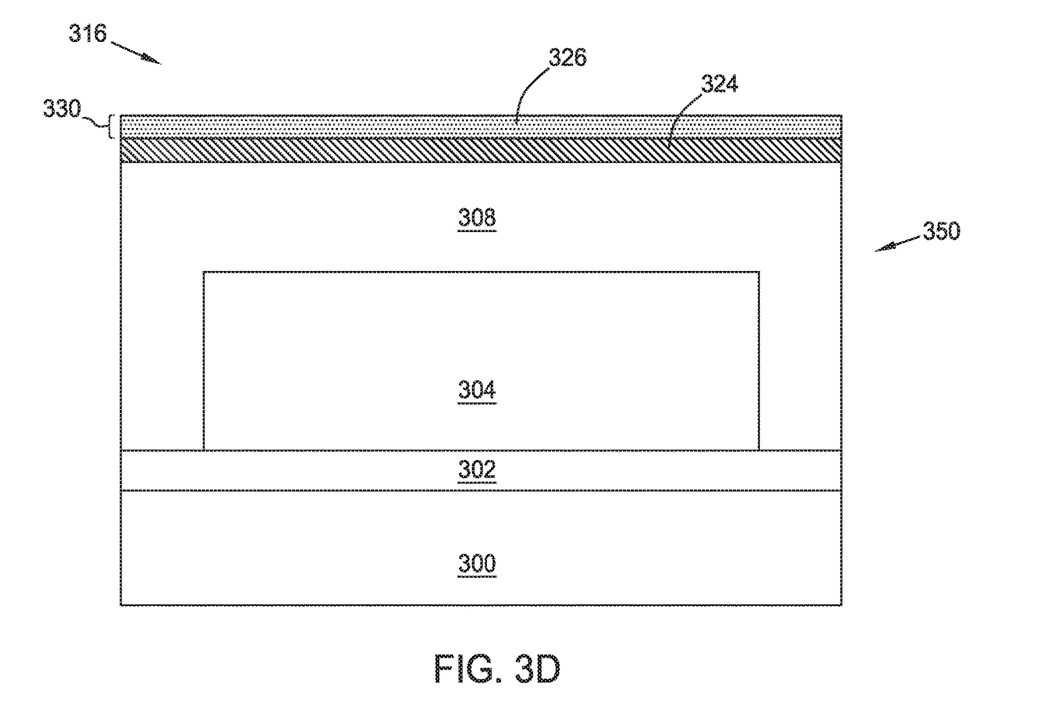

In operation 212, operation 208 and operation 210 are repeated one or more times to deposit one or more additional sublayers of the partial buffer layer 316 on the first cured sublayer 324, individually curing each deposited sublayer prior to depositing additional sublayers. For example, as shown in FIG. 3D, a second sublayer 326 of the partial buffer layer 316 is deposited on the first cured sublayer 324, covering the first cured sublayer 324. The second sublayer 326 of the partial buffer layer 316 may have a thickness 330 of about 0.05-0.2 μm. The first thickness 322 of the first sublayer 320 and the second thickness 330 of the second sublayer 326 may be the same thickness, or the first thickness 322 and the second thickness 330 may be different. While not shown in the zoomed-in section illustrated in FIG. 3D, the second sublayer 326 of the partial buffer layer 316 is deposited over the second portion 308b of the first barrier layer 308 disposed on the mask 310.

Figure 3E:
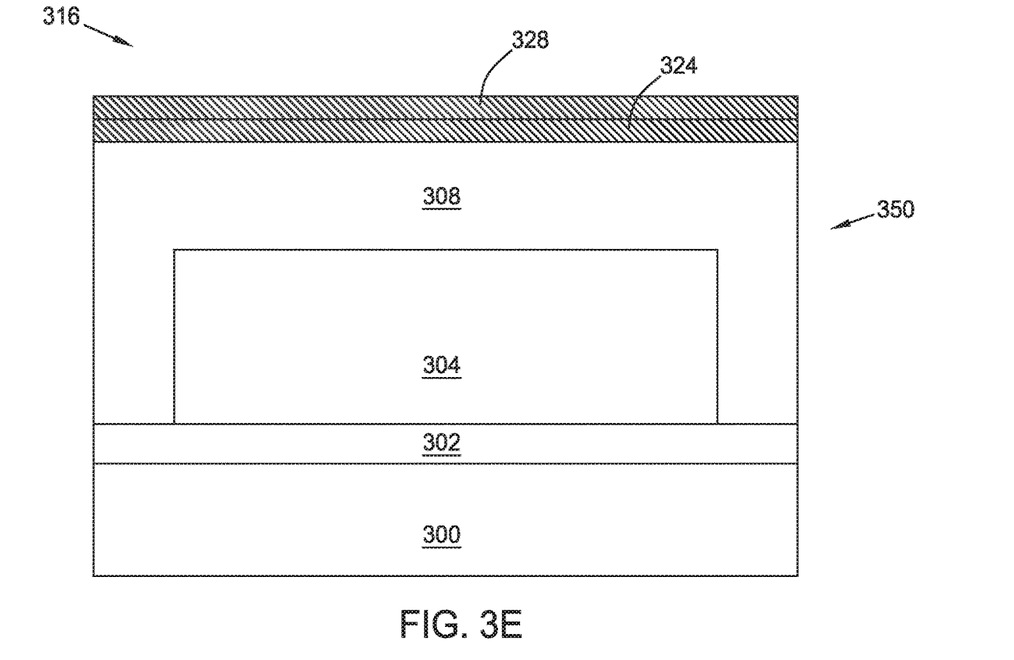
Figure 3F:
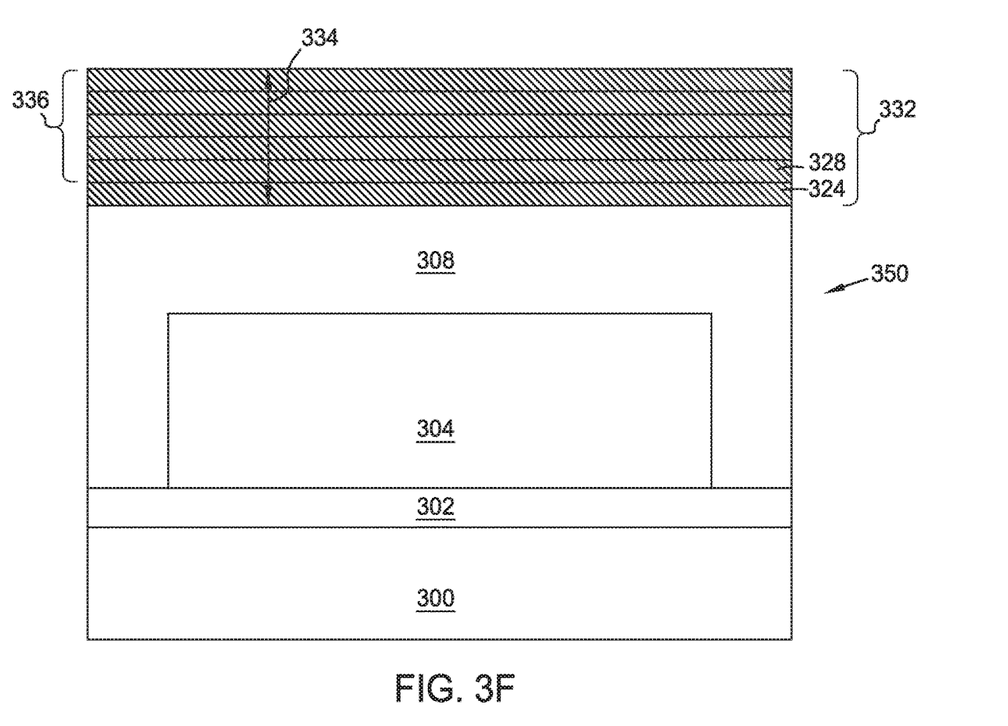

As shown in FIG. 3E, the second sublayer 326 of the partial buffer layer 316 is then cured to form a second cured sublayer 328 of the partial buffer layer 316. One or more additional sublayers 336 of the partial buffer layer 316 may then be individually deposited and cured, one sublayer at a time, to form a completed buffer layer 332, as shown in FIG. 3F. Each time an additional sublayer 336 is deposited, the additional sublayer 336 is cured before depositing yet another addition sublayer 336. Stated otherwise, additional sublayers 336 are only deposited on cured sublayers. Each additional sublayer 336 maintains its flexibility and optical transmittance as one or more additional sublayers layers are subsequently deposited thereon.

The completed buffer layer 332 may have a thickness 334 of about 0.5-1.5 In one embodiment, 1-15 additional sublayers 336 may be deposited on the first cured sublayer 324 to form the completed buffer layer 332. In another embodiment, the completed buffer layer 332 comprises 10 sublayers, each sublayer having a thickness of about 0.1 The completed buffer layer 332 maintains its flexibility and optical transmittance as barrier layers are subsequently deposited thereon.

Figure 3G:
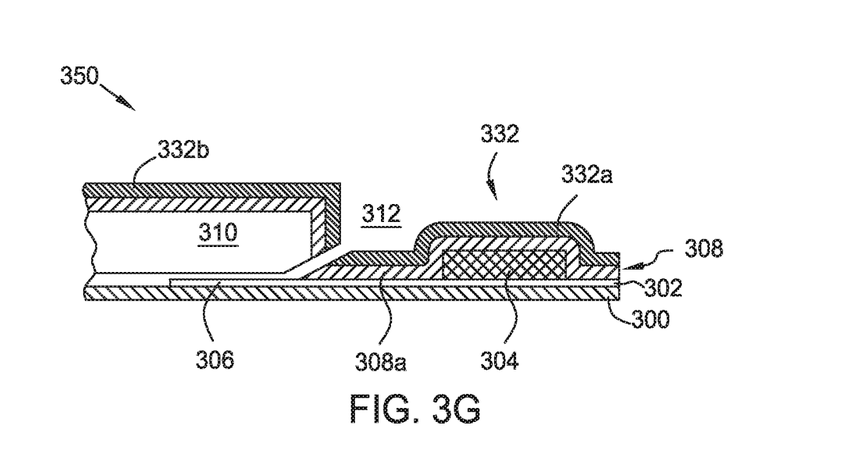

FIG. 3G illustrates a zoomed out view of the completed buffer layer 332 deposited on OLED device 350. As shown in FIG. 3G, the completed buffer layer 332 comprises a first portion 332a and a second portion 332b. The first portion 332a of the completed buffer layer 332 is deposited over the first portion 308a of the first barrier layer 308a and the second portion 332b of the completed buffer layer 332 is deposited over the second portion 308b of the first barrier layer 308.

Figure 3H:
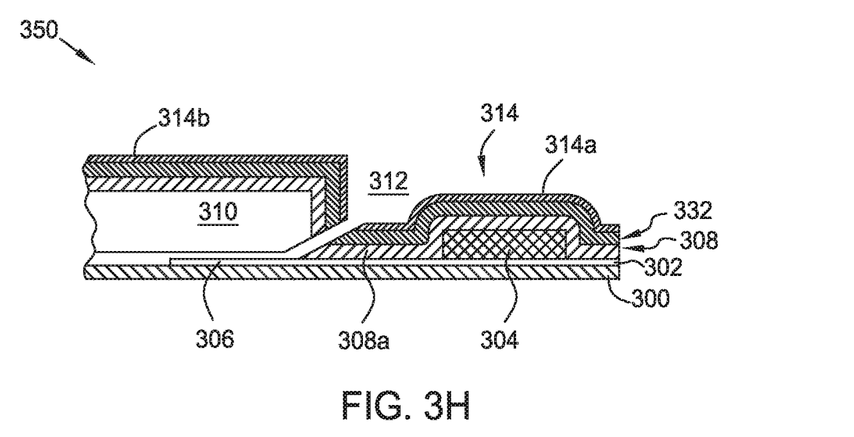

At operation 214, a second barrier layer 314 is deposited on the substrate 300, covering the completed buffer layer 332 and the first barrier layer 308 formed on the OLED structure 304, as shown in FIG. 3H. The second barrier layer 314 includes a first portion 314a deposited over the first portion 332a of the completed buffer layer 332 and a second portion 314b deposited over the second portion 332b of the completed buffer layer 332.

The second barrier layer 314 may be a dielectric layer similar to the first barrier layer 308. The second barrier layer 314 is a dielectric layer such as SiN, SiON, $SiO_2$, or other suitable dielectric layers. The second barrier layer 314 may be deposited by a suitable deposition technique, such as CVD, PVD, spin-coating, or other suitable technique.

The deposition of the barrier layers, deposition of the sublayers of the buffer layer, and the curing of the sublayers of the buffer layer as described herein may be performed in a vacuum environment of a single deposition chamber, such as the PECVD chamber 100. Performing the deposition and curing operations in a vacuum environment of a single deposition chamber allows the OLED device to be formed without ever having to break the vacuum, which eliminates or reduces delamination of the various layers, and further eliminates or reduces the risk of contaminates being introduced into the process chamber.

Purging of the process chamber may be performed between cycles to further minimize the risk of contamination. In one embodiment, the first barrier layer is deposited. The chamber is then purged so the gases used for the deposition of the first barrier layer are not present in the chamber for the subsequent processes. Next, each of the plurality of sublayers of the buffer layer is deposited and individually cured. The chamber is then purged again so the gases used for the deposition and curation of the plurality of sublayers of the buffer layer are not present in the chamber for the subsequent processes. In one implementation, each time a sublayer of the buffer layer is deposited, the chamber may be purged prior to curing the sublayer. In such in implementation, the sublayer is then cured, and the chamber may be purged once more prior to depositing additional sublayers of the buffer layer. Thus, each time a sublayer is deposited, the chamber may be purged, and each time a sublayer is cured, the chamber may be purged again. Lastly, the second barrier layer is deposited. The single chamber process may be advantageous in reducing cycle times as well as reducing the number of chambers (and equipment costs) of using a multiple chamber process.

In summary, an OLED device is formed having a buffer layer comprising a plurality of sublayers sandwiched between two barrier layers. Each of the sublayers of the buffer layer are individually deposited and cured prior to depositing additional sublayers, reducing or eliminating delamination of the various layers of the OLED device. Furthermore, the sublayers of the buffer layer are deposited and cured in a vacuum environment of a single process chamber. Performing the deposition and curing operations in a vacuum environment of a single deposition chamber allows the OLED device to be formed without ever having to break the vacuum, which further eliminates or reduces delamination of the various layers. Additionally, the risk of contaminates being introduced into the process chamber is eliminated or reduced, which enables the completed buffer layer to maintains its flexibility and optical transmittance. Moreover, performing the deposition and curing operations in a vacuum environment of a single deposition chamber simplifies the method of formation of the OLED device, which may increase throughout and reduce associated costs.

While the foregoing is directed to embodiments of the present disclosure, other and further embodiments of the disclosure may be devised without departing from the basic scope thereof, and the scope thereof is determined by the claims that follow.

What is claimed is:

1. A method for forming an organic light emitting diode (OLED) device, comprising:
   depositing a first barrier layer on a region of a substrate having an OLED structure disposed thereon;
   depositing a first sublayer of a buffer layer on the first barrier layer;
   curing the first sublayer with a mixed gas plasma comprising at least one pair selected from the group consisting of: (a) $NH_3$ and $N_2O$, (b) $H_2$ and $N_2O$, (c) $H_2$ and $O_2$, or (d) $NH_3$ and $O_2$, wherein curing the first sublayer comprises generating water from the mixed gas plasma in a chamber in which the curing occurs;
   repeating the deposition of the first sublayer and the curing of the first sublayer one or more times to form a completed buffer layer; and
   depositing a second barrier layer on the completed buffer layer.

2. The method of claim 1, wherein the completed buffer layer comprises fluorinated plasma-polymerized hexamethyldisiloxane (pp-HMDSO:F).

3. The method of claim 1, wherein the repeating of the deposition of the first sublayer and the curing of the first sublayer is repeated between 1 and 15 times.

4. The method of claim 1, wherein the depositing of the first sublayer, the curing of the first sublayer, and the repeating of the deposition of the first sublayer and the curing of the first sublayer are performed in a vacuum environment of a single process chamber.

5. The method of claim 4, wherein the single process chamber is a plasma enhanced chemical vapor deposition (PECVD) chamber.

6. The method of claim 1, wherein the first barrier layer and the second barrier layer each individually comprise SiN, SiON, $SiO_2$, $Al_2O_3$, or AlN.

7. A method for forming an OLED device in a vacuum environment of a single process chamber, comprising:
   depositing a first barrier layer on a region of a substrate having an OLED structure disposed thereon;
   depositing a first sublayer of a buffer layer on the first barrier layer, wherein the first sublayer has a thickness between about 0.05-0.2 μm;
   curing the first sublayer with a mixed gas plasma, wherein curing the first sublayer comprises generating water from the mixed gas plasma in the single process chamber in which the curing occurs;
   repeating the deposition of the first sublayer and the curing of the first sublayer one or more times to form a completed buffer layer, wherein the completed buffer layer has a thickness between about 0.5-1.5 μm; and
   depositing a second barrier layer on the completed buffer layer.

8. The method of claim 7, wherein the completed buffer layer comprises fluorinated plasma-polymerized hexamethyldisiloxane (pp-HMDSO:F).

9. The method of claim 7, wherein the mixed gas plasma comprises $NH_3$ and $N_2O$, $H_2$ and $N_2O$, $H_2$ and $O_2$, or $NH_3$ and $O_2$.

10. The method of claim 7, wherein the repeating of the deposition of the first sublayer and the curing of the first sublayer is repeated between 1 and 15 times.

11. The method of claim 7, wherein the single process chamber is a PECVD chamber.

12. A method for forming an OLED device in a vacuum environment of a single process chamber, comprising:
   forming a contact layer over a substrate;
   forming an OLED structure over the contact layer;
   depositing a first barrier layer over the OLED structure;
   depositing a first sublayer of a buffer layer on the first barrier layer;
   curing the first sublayer with a mixed gas plasma, wherein curing the first sublayer comprises generating water from the mixed gas plasma in the single process chamber in which the curing occurs;
   repeating the deposition of the first sublayer and the curing of the first sublayer one or more times to form a completed buffer layer, wherein the completed buffer layer has a thickness between about 0.5 μm to about 1.5 μm; and
   depositing a second barrier layer on the completed buffer layer.

13. The method of claim 12, wherein the completed buffer layer comprises fluorinated plasma-polymerized hexamethyldisiloxane (pp-HMDSO:F).

14. The method of claim 12, wherein the mixed gas plasma comprises $NH_3$ and $N_2O$, $H_2$ and $N_2O$, $H_2$ and $O_2$, or $NH_3$ and $O_2$.

15. The method of claim 12, wherein the first sublayer has a thickness between about 0.05-0.2 μm.

16. The method of claim 12, wherein the first barrier layer and the second barrier layer each individually comprise SiN, SiON, SiO$_2$, Al$_2$O$_3$, or AlN.

17. The method of claim 12, wherein the single process chamber is a PECVD chamber.

18. The method of claim 12, wherein the first sublayer is cured for about 10 seconds to about 30 seconds.

19. The method of claim 1, wherein the completed buffer layer has a thickness between about 0.5 µm to about 1.5 µm.

20. The method of claim 7, wherein the first barrier layer and the second barrier layer each individually comprise SiN, SiON, SiO$_2$, Al$_2$O$_3$, or AlN.

* * * * *